United States Patent [19]

Bringmann et al.

[11] Patent Number: 4,786,887
[45] Date of Patent: Nov. 22, 1988

[54] THIN-FILM STRAIN GAUGE SYSTEM AND METHOD OF MANUFACTURING SAME

[75] Inventors: Udo Bringmann, Halstenbek; Olaf H. Dössel, Ellerau; Klaus W. Gerstenberg, Halstenbek; Gerhard Kürsten, Hamburg; Reiner U. Orlowski, Quickborn; Detlef G. Schön, Halstenbek, all of Fed. Rep. of Germany

[73] Assignee: U.S. Philips Corporation, New York, N.Y.

[21] Appl. No.: 80,183

[22] Filed: Jul. 30, 1987

Related U.S. Application Data

[63] Continuation of Ser. No. 694,723, Jan. 25, 1985, abandoned.

[30] Foreign Application Priority Data

Jan. 30, 1984 [DE] Fed. Rep. of Germany ....... 3403042

[51] Int. Cl.[4] .............................................. G01L 1/22
[52] U.S. Cl. ......................................... 338/2; 338/5; 29/621.1
[58] Field of Search ........................................ 338/2–5; 29/610 SG

[56] References Cited

U.S. PATENT DOCUMENTS

| 4,132,829 | 1/1979 | Hudis ............................... 428/411.1 |
| 4,137,365 | 1/1979 | Wydeven et al. .................... 428/412 |
| 4,164,607 | 8/1979 | Thiel et al. ...................... 338/308 X |
| 4,307,371 | 12/1981 | Ort .................................... 338/2 |
| 4,368,579 | 1/1983 | Ericksen et al. ............... 29/610 SG |
| 4,396,900 | 8/1983 | Hall .................................... 338/309 |
| 4,510,671 | 4/1985 | Kurtz et al. ................ 29/610 SG X |
| 4,511,877 | 4/1985 | Nishikawa et al. ........ 29/610 SG X |
| 4,562,725 | 1/1986 | Oka et al. .......................... 338/35 X |
| 4,599,678 | 7/1986 | Wertheimer et al. ............... 361/323 |

Primary Examiner—E. A. Goldberg
Assistant Examiner—Marvin M. Lateef
Attorney, Agent, or Firm—Norman N. Spain

[57] ABSTRACT

Thin film strain gauge system consisting of an elastically deformable flexible metallic substrate on which an electrically insulating layer of a plasma-polymerized material, in particular of Si:N:O:C:H-containing compounds and thereon a structured resistance layer as well as an electrically readily conducting layer having a structure for the electrical contacting are provided.

16 Claims, 1 Drawing Sheet

THIN-FILM STRAIN GAUGE SYSTEM AND METHOD OF MANUFACTURING SAME

This is a continuation of application Ser. No. 694,723, filed Jan. 25, 1985, now abandoned.

BACKGROUND OF THE INVENTION

The invention relates to a thin-film strain gauge system there having an elastically deformable flexible substrate on which are provided an electrically insulating layer and thereon a structured resistance layer as well as an electrically readily conductive layer having a structure for the electrical contacting, as well as to a method of manufacturing such a strain gauge system.

For the measurement of the physical quantities mass, power, torque, acceleration, flow, pressure and pressure differential, measuring transducers with electric output signals are preferably used. Measuring transducers based on strain gauges comprise an elastic element (substrate) which is deformed by the measuring quantity, as well as a resistor by means of which this deformation is converted into an electrical signal. Such an electrical signal may then be amplified and be transmitted over large distances. It may be introduced into control loops, processed by computers or stored and it can also be shown easily on displays. The resistor (resistance layer) can achieve the conversion of the deformation into an electrical signal through a change of its resistance value.

As a material for the resistance layers there used metal alloys and semiconductors. For the measurement of the low measuring resistance variation, for example, four resistance paths formed from the resistance layer, hereinafter referred to as strain gauges, are combined to form a symmetrical wheatstone bridge.

The deviation from the bridge equilibrium is proportional to the elastic deformation of the strain gauge.

Thin-layer strain gauge systems are known in various forms in which in particular the properties of the electrically insulating layer between the elastic element and the resistance layer are of importance. For the electrically insulating layer various materials have been used which in practice, however, have proved to exhibit certain disadvantages.

For example, a thin-layer strain gauge system in which inorganic layers of oxides ($Al_2O_3$, MgO or forsterite $2MgO.SiO_2$) are manufactured by means of RF cathode sputtering, electron beam evaporation or with heatable evaporators is known from DE-OS No. 27 41 055.

Thin-layer strain gauge systems in which inorganic layers of silicon oxide or silicon nitride are provided by means of plasma chemical vapour deposition are known from DE-OS No. 30 41 756.

European patent application No. 53 337 discloses thin-layer strain gauge systems in which the electrically insulating layer consists of polyimides, polyamide-imides or epoxy-modified polyimides, in which the layer materials are provided on the substrate as a solution, are centrifuged and are cured by a tempering treatment.

Various disadvantages are associated with the known electrically insulating layers.

Vapour-deposited layers or layers provided by cathode sputtering result in the coating of only a poor lateral quality. On substrates having microscopically small unevennesses this leads to short-circuits between the elastic substrate and the resistance layer.

The inorganic materials are moreover comparatively brittle and show haircracks even under small loads which adversely influence the long-life stability of the strain gauge. Under higher loads it results in a fracture which leads to interruptions of the resistance paths.

Although the above-mentioned organic layers may show a high maximum expansibility, they show poor creeping properties, in particular at higher temperatures.

BRIEF SUMMARY OF THE INVENTION

It is the object of the invention to improve the thin-film strain gauge system mentioned in the opening paragraph in such manner that it does not exhibit the above-mentioned disadvantages, hence to provide a thin-film strain gauge system whose electrically insulating layers lead to a good lateral coating, show a high maximum expansibility and at the same time are stable to above 300° C. and which can compensate for the creeping of the resilient material (substrate).

According to the invention this object is achieved by having the electrically insulating layer consist of a plasma-polymerized material.

According to advantageous further embodiments of the invention the electrically insulating layer consists plasma-polymerized silicones or rigid-analogous silicones plasma-polymerized silicones or silizanes.

A method of manufacturing the thin-film strain gauge system according to the invention is characterized in that an electrically insulating layer of a plasma-polymerized material is formed by deposition from the gaseous phase on an elastically deformable flexible substrate, after which a resistance layer is provided on the polymer layer, is then structured to form at least a resistance track and electrical, thin-layer connections are formed on the structured resistance layer.

According to advantageous further embodiments of the method according to the invention the electrically insulating layer is formed in a plasma chemical vapour deposition device (PCVD device) in which at least one monomeric gas is introduced from which by high frequency excitation of the gas phase molecules polymerized Si:N:O:C:H-containing compounds can be formed which are deposited on the substrate present in the PCVD device. Advantageously hexamethyldisilazane is used as a monomeric gas.

The advantages which can be achieved by means of the invention consist in particular in that the electrically insulating layers of plasma-polymerized material have a good lateral coating. They show a good expansibility, are stable up to above 300° C., are water repellant and chemically resistant. They readily adhere to all materials from which the elastic substrate is usually manufactured; moreover, there is also a good bonding to the overlying resistance layer. The layers can be prepared in any thickness suitable for the end in view between 0.2 μm and 20 μm. Moreover the possibility is obtained to of compensating for the creeping of the resilient material (substrate material) by suitable adjustment of the thickness and the composition of the layer.

The insulating layers according to the invention show excellent properties for the intended purposes: the likelihood of a short circuit to the elastic substrate (resilient member) is very small, which results in the advantage of a high yield in the manufacture of the strain gauge systems according to the invention. The electrically insulating layer according to the invention also shows a very good expansibility. Typical expansions occurring in pressure and force transducers are $1 \times 10^{-3}$ m/m. In zones of non-uniform expansion, peaks in the expansion of $2 \times 10^{-3}$ m/m can easily occur. If an overload strength should be ensured, expansions up to $4 \times 10^{-3}$ m/m should be withstood without damage. The present insulation layers satisfy said requirements. The present electrically insulating layers are stable up to 300° C. This is a particularly important advantage, for, on the one hand, high process temperatures occur during the manufacture of the expansion-sensitive resistance layer on the electrically insulating layer, and, on the other hand, the adjustment of the desired properties of the resistance layers usually requires a thermal after-treatment at which temperatures up to 300° C. are typical. The present electrically insulating layer is also insensitive with respect to a high relative air humidity. In conventional strain gauge systems in which a resistance foil is provided on a synthetic resin support which is adhered to an elastic deformation carrier, the adhesive and the carrier material (substrate) consist of organic materials which expand at a high relative air humidity and so interfere with the measured signal of the measuring instrument.

The present electrically insulating layers have excellent bonding properties both to the elastic substrate and to the resistance layer.

In oxidic insulation layers, for example, the problem exists of the poor bonding and this difficulty must be overcome by providing additional layers which serve as bonding intermediate layers, which, for industrial manufacture, means an additional process step and hence higher cost.

The present electrically insulating layers also show a particularly good chemical resistance with respect to agressive liquids and gases. This is of advantage in regard to the reliability and the long-life stability of the measuring instrument. In no case may be electrically insulating layer be attacked by the chemicals used in the necessary photolithographic structuring process.

A further advantage of the present electrically insulating layers is that they can be manufactured to be very thin, having thicknesses of approximately 0.2 $\mu$m to 20 $\mu$m, in which, however, they are very free from pinholes, so that they are very dense.

Apart from the increase of the process cost which occurs in providing thick layers in thin-film technology, a good thermal coupling between the elastic substrate and the resistance layer is of importance. An immediate bonding is also desired for an optimum transmission of the expansion profile of the elastic substrate to the strain gauge formed from the resistance layer.

A further advantage is that the present electrically insulating layers can be directly adjusted in their creeping properties. The slow deformation of the elastic substrate (spring member) under constant load is referred to as creeping. In good resilient materials the expansion at the surface changes, within five minutes after a variation of the load, by values between 0.01% and 0.05% and in this manner causes an error in the pressure and force measurements, respectively. In bonded strain gauge systems it is possible to compensate for said creeping, by particularly careful processing during adhering, for in measuring instruments manufactured in this manner the adhesive also fatigues and so produces an opposite creeping.

According to current teaching, such a compensation of the creepage of the elastic substrate (resilient member) is not possible with thin-film strain gauge systems (compare W. Ort. Wägen und Dosieren, 1979, No. 3, p. 86). However, it has surprisingly been found that with the thin-film strain gauge systems manufactured according to the invention it is possible, in contrast with the current teaching, to compensate for the creeping of the material of the elastic substrate. Different materials for the elastic substrates show different values both in the final value after 5 minutes and in the time variation of the creeping. By directed adjustment of the thickness and the proparation parameters the opposite creeping behaviour of the electrically insulating layers can be accurately adjusted so that the creepage error of the strain gauge system remains below 0.01% on typical materials for the elastic substrate, for example, steel. For this purpose reference is made to the data of the example.

DETAILED DESCRIPTION OF THE INVENTION

Figure 1:
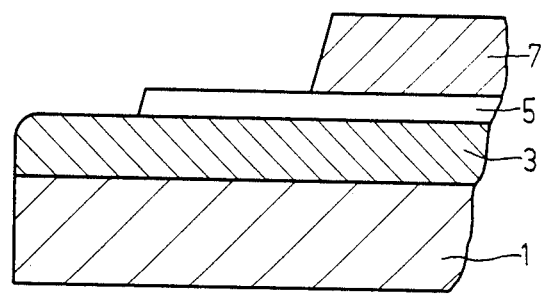
FIG. 1 is a cross-sectional view of a thin film strain gauge system of the invention and FIG. 2 is a diagram of an RF-diode arrangement for manufacturing an electrically insulating layer of the invention.

An embodiment of the invention will be described in greater detail with reference to the drawings in which FIG. 1 is a diagrammatic sectional view through a thin film strain gauge system according to the invention.

Figure 2:
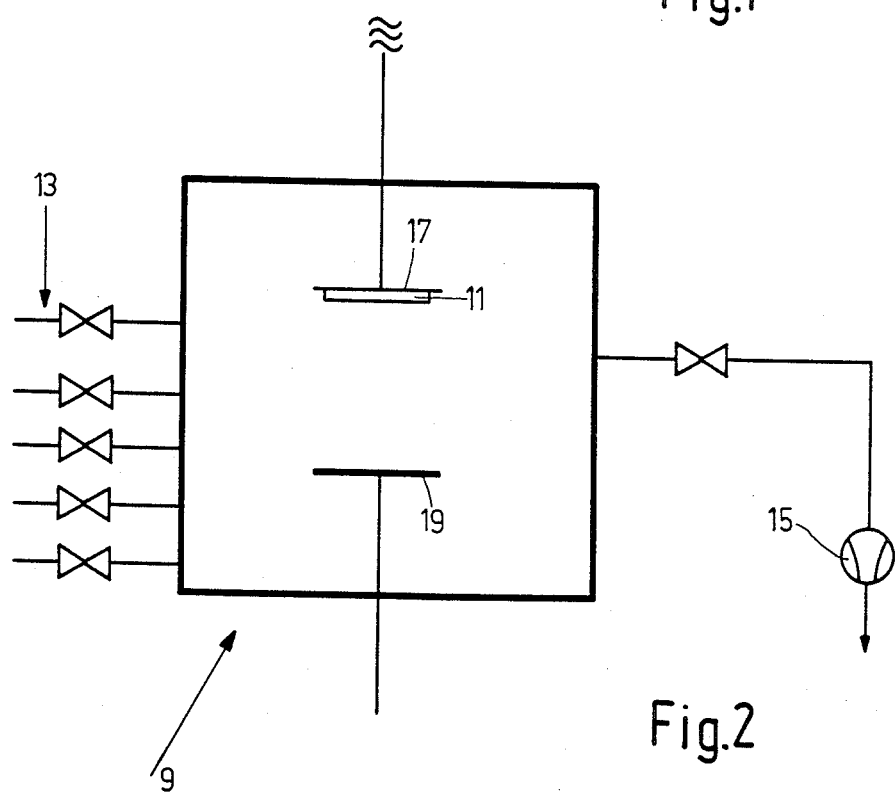

FIG. 2 shows a diagram of an RF-diode arrangement for the manufacture of an electrically insulating layer according to the invention.

FIG. 1 shows diagrammatically the construction of a layer of a thin-film strain gauge system. An approximately 3 $\mu$m thick layer of plasma-polymerized material is provided as an electrically insulating layer 3 on an elastically deformable, flexible substrate 1, for example of steel, and hereon an approximately 0.3 $\mu$m thick resistance layer 5, for example of a nickel-chromium alloy is provided by means of cathode sputtering. An approximately 1 $\mu$m thick readily conductive layer 7, for example of gold, is then provided for the manufacture of contrast pads and internal connections, for example, by cathode sputtering.

As process gases for the manufacture of the plasma-polymerized electrically insulating layer 3 hexamethyldisilazan was used in a plasma chemical vapour deposition device 9 (compare FIG. 2). The introduced gas is split in the high-frequency plasma produced in the PCVD device 9. On a substrate provided in the PCVD device 9 on one of the electrodes 17, 19, three-dimensionally crosslinked macromolecules with Si-O-Si-bonds or Si-N-Si-bonds are formed by polymerization reactions.

A layer manufactured with hexamethyldisilazan as a silicon-containing process gas was prepared under the following process conditions:

The PCVD device 9 was first evacuated with a vacuum pump 15 to a pressure of a few $10^{-4}$ Pa. Hexamethyldisilazan was supplied as a process gas via one of the inlets 13 at a pressure of 0.02 Pa. The electrode spacing was 50 mm. A 27 MHz HF generator was used. The potential adjusting at the RF electrode 17 on which at least one substrate 11 to be coated was provided was 250V direct voltage. After 60 minutes' deposition a 3 $\mu$m thick polymer layer 3 was obtained on the substrate (s) 11.

This example describes the excitation of the gas phase molecules by a high frequency voltage. Besides the excitation by means of the diode arrangement shown in FIG. 2 an inductive or a capacitive excitation of the gas phase molecules is in principle also possible.

After depositing the electrically insulating layer 3 the resistance layer 5 is provided. In addition to the already mentioned alloys NiCr or PtW, CrSi or doped semiconductors are also suitable as materials for said layers. CrNi was used for the said examples. Resistance layers of all the said materials are very stable and comparatively high-ohmic. The resistance layer can be provided by any method of thin-layer technology known to those skilled in the art. According to this example an RF-cathode sputtering process was used.

The layer 7 of electrically readily conducting material, for example gold, present on the resistance layer 5 for the connection contacting is also manufactured by RF cathode sputtering.

In two photolithographic process steps the contact pads of the gold layer 7 as well as a Wheatstone bridge structure of the resistance layer 5 are manufactured. The required etching steps may be carried out wet chemically or by ion bombardment (back sputtering).

The electrical connections of the resistance bridge are formed by four gold wires which are connected on the contact pads formed from the layer 7 by means of thermocompression.

The temperature coefficient of the electric resistance ($TC_R$) of the strain gauges obtained from the resistance layer normally has a low, negative value. By a thermal after-treatment (tempering) at approximately 300° C., however, it can be adjusted. Depending on the duration of tempering the resistance values become smaller, the $TC_R$ on the contrary becomes higher and even positive. By choosing a suitable tempering period the influence of the temperature on the resistance can be kept negligibly small. These measures are known to shose skilled in the art.

As the last step in the process it is recommendable to provide a passivating layer on the strain gauge system which may not adversely influence the elastic behaviour of the flexible substrate; advantageously its layer thickness is limited to approximately 10 $\mu$m.

Technical data of thin-film strain gauge systems manufactured according to the invention: Substrate: noble steel, polished Insulating layer: polymer layer, layer thickness 3 $\mu$m
Resistance layer: NiCr, layer thickness 0.3 $\mu$m
Sheet resistance: 4 $\Omega/\square$
Resistance of an individual resistance path: 130$\Omega$
Temperature coefficient of an individual resistance path: +10 ppm/K
Behaviour of the relative resistance variation to the expansion (expansion sensitivity): 2.2
Creeping (creeping error): <0.01%
Resistance of the insulating layer: >$10^{11}\Omega$.cm
Maximum permissible expansion: 2 to 10×$10^{-3}$ m/m
Pinhole density: 2/cm$^2$
Breakdown field strength: 150V/$\mu$m.

What is claimed is:

1. A thin-film strain gauge system comprising an elastically deformable flexible substrate, an insulating layer present on a surface of said substrate, a resistance layer on the surface of said insulating layer away from said substrate and a patterned electrically conductive layer on the surface of said resistance layer characterized in that the insulating layer consists of a plasma polymerized material.

2. A thin-film strain gauge system as claimed in claim 1, characterized in that the electrically insulating layer (3) consists of Si:N:O:C:H-containing compounds.

3. A thin-film strain gauge system as claimed in claim 2, characterized in that the electrically insulating layer (3) consists of plasma-polymerized oxygen containing silicones or analogous nitrogen containing silicones.

4. A thin-film strain gauge system as claimed in claim 1, characterized in that the electrically insulating layer (3) has a thickness in the range from 0.2 $\mu$m to 20 $\mu$m.

5. A thin-film strain gauge system as claimed in claim 1, characterized in that the substrate (1) consists of steel.

6. A thin-film strain gauge system as claimed in claim 1, characterized in that the substrate (1) consists of a copper-beryllium alloy.

7. A thin-film strain gauge system as claimed in claim 1, characterized in that the resistance layer (5) consists of a metal alloy.

8. A thin-film strain gauge system as claimed in claim 7, characterized in that the resistance layer (5) consists of a nickel-chromium alloy.

9. A thin-film strain gauge system as claimed in claim 1, characterized in that the resistance layer (5) consists of a doped semiconductor material.

10. A thin-film strain gauge system as claimed in claim 9, characterized in that the resistance layer consists of silicon doped with boron or phosphorus.

11. A method of manufacturing a thin-film strain gauge system comprising:
    (a) providing an electrically insulating layer of a plasma-polymerized material on an elastically deformable, flexible, substrate by deposition from a gaseous phase which phase comprises a plasma-polymerizable material;
    (b) providing a resistance layer on said electrically insulating layer,
    (c) structuring said resistance layer to form at least one resistance path and
    (d) forming thin layer electrical connections on said structured resistance layer.

12. The method of claim 11 wherein the substrate is introduced into a plasma chemical vapor deposition device (PCVD device), monomeric gases, from which polymerized oxygen containing silicon or analogous nitrogen containing silicones can be formed by high frequency excitation, are introduced into said PCVD device said gases are subjected to said high frequency excitation to thereby form said polymerized silicone and an insulating layer, formed from said polymerized silicones is deposited on said substrate.

13. A method as claimed in claim 12, characterized in that hexamethyldisilazane is introduced as a monomeric process gas.

14. A method as claimed in claim 11, characterized in that the resistance layer is provided by vapour deposition.

15. A method as claimed in claim 11, characterized in that the resistance layer is provided by cathodic high frequency sputtering.

16. A method as claimed in claim 11, characterized in that the resistance layer is provided by plasma chemical vapour deposition.

* * * * *